United States Patent
Tsai et al.

(10) Patent No.: US 8,841,197 B1
(45) Date of Patent: Sep. 23, 2014

(54) METHOD FOR FORMING FIN-SHAPED STRUCTURES

(71) Applicant: United Microelectronics Corp., Hsin-Chu (TW)

(72) Inventors: Shih-Hung Tsai, Tainan (TW); Chun-Hsien Lin, Tainan (TW); Chien-Ting Lin, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/786,485

(22) Filed: Mar. 6, 2013

(51) Int. Cl.
*H01L 21/76* (2006.01)
*H01L 21/302* (2006.01)
*H01L 21/461* (2006.01)
*H01L 21/308* (2006.01)

(52) U.S. Cl.
CPC ............................. *H01L 21/308* (2013.01)
USPC ........... 438/424; 438/425; 438/426; 438/689; 438/690; 438/691; 438/692; 438/693

(58) Field of Classification Search
CPC ................... H01L 21/76224; H01L 21/76229; H01L 27/10876; H01L 21/845
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 * | 12/2008 | Beintner et al. | 438/149 |
| 7,531,437 B2 | 5/2009 | Brask | |
| 7,569,857 B2 | 8/2009 | Shaheen | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0054464 A1 * | 3/2007 | Zhang | 438/424 |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2012/0280331 A1 * | 11/2012 | Ou et al. | 257/401 |

* cited by examiner

Primary Examiner — Duy Deo
(74) Attorney, Agent, or Firm — Winston Hsu; Scott Margo

(57) ABSTRACT

The present invention provides a method for forming a fin structure comprising the following steps: first, a multiple-layer structure is formed on a substrate; then, a sacrificial pattern is formed on the multiple-layer structure, a spacer is formed on the sidewall of the sacrificial pattern and disposed on the multiple-layer structure, the sacrificial pattern is removed, the spacer is used as a cap layer to etch parts of the multiple-layer structure, and then the multiple-layer structure is used as a cap layer to etch the substrate and to form at least one fin structure in the substrate.

16 Claims, 7 Drawing Sheets

US 8,841,197 B1

METHOD FOR FORMING FIN-SHAPED STRUCTURES

BACKGROUND OF THE INVENTION

1. Field of the Invention

The present invention generally relates to a semiconductor manufacturing process, and more specifically to a method for forming a fin-shaped structure.

2. Description of the Prior Art

With the trend in the industry being towards scaling down the size of the metal oxide semiconductor transistors (MOS), three-dimensional or non-planar transistor technology, such as fin field effect transistor technology (Fin FET), has been developed to replace planar MOS transistors. In current techniques, in order to achieve sub-lithographic features, a regular photolithography and an etching process accompanied with a pull back process are performed to form fin structures in Fin FETs.

However, as the size of the FETs shrink, the electrical and physical requirements in each part of the multi-gate FET become critical, like the sizes and shapes of the fin-shaped structures and the spacing between each fin-shaped structure for example. Thus, how to reach standard requirements and overcome the physical limitations has become an important issue in the industry of the FETs.

However, as the size of the FETs shrink, the electrical and physical requirements in each part of the multi-gate FET become critical, like the sizes and shapes of the fin-shaped structures and the spacing between each fin-shaped structure for example. Thus, how to reach standard requirements and overcome the physical limitations has become an important issue in the industry of the FETs.

SUMMARY OF THE INVENTION

The present invention provides a method for forming a fin structure that transfers the pattern of the spacer to a multiple layer structure in order to protect the fin structure from being damaged during the manufacturing process, thereby improving the quality of the fin structure.

The present invention provides a method for forming a fin structure, comprising the following steps: first, a multiple-layer structure is formed on a substrate; then, a sacrificial pattern is formed on the multiple-layer structure, a spacer is formed on the sidewall of the sacrificial pattern and disposed on the multiple-layer structure. The sacrificial pattern is then removed, and the spacer is used as a cap layer to etch parts of the multiple-layer structure, and the multiple-layer structure is used as a cap layer to etch the substrate and to form at least one fin structure in the substrate.

The present invention further comprises a multiple layer structure disposed between the substrate and the spacer, wherein the spacer is first used as a mask to transfer the pattern of the spacer to the multiple layer structure, and the patterned multiple layer structure is then used as a mask to transfer the pattern to the substrate so as to form a plurality of fin structures in the substrate. In this way, a flatter surface may be formed on the top of the multiple layer structure through at least two pattern transfer processes, hence the mask disposed on the fin structure is not easily damaged during the pattern transfer process, and the pattern can be transferred to the fin structure completely, thereby improving the process yield.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
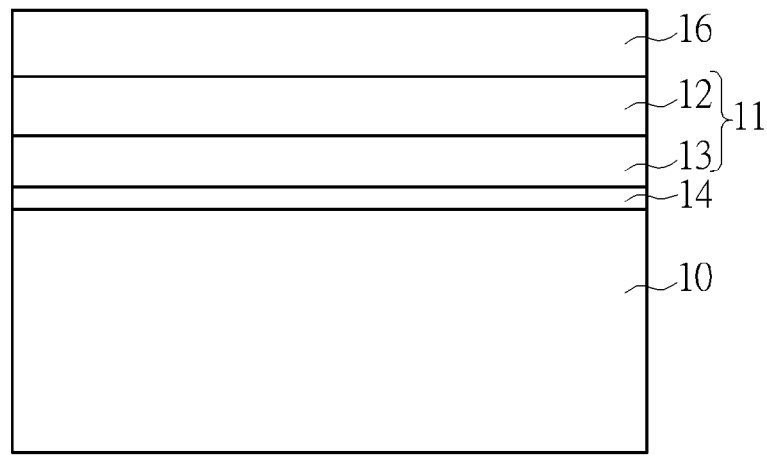
FIGS. 1-9 are schematic, cross-sectional diagrams showing a method for forming a fin structure according to the first preferred embodiment of the present invention.
Figure 11:
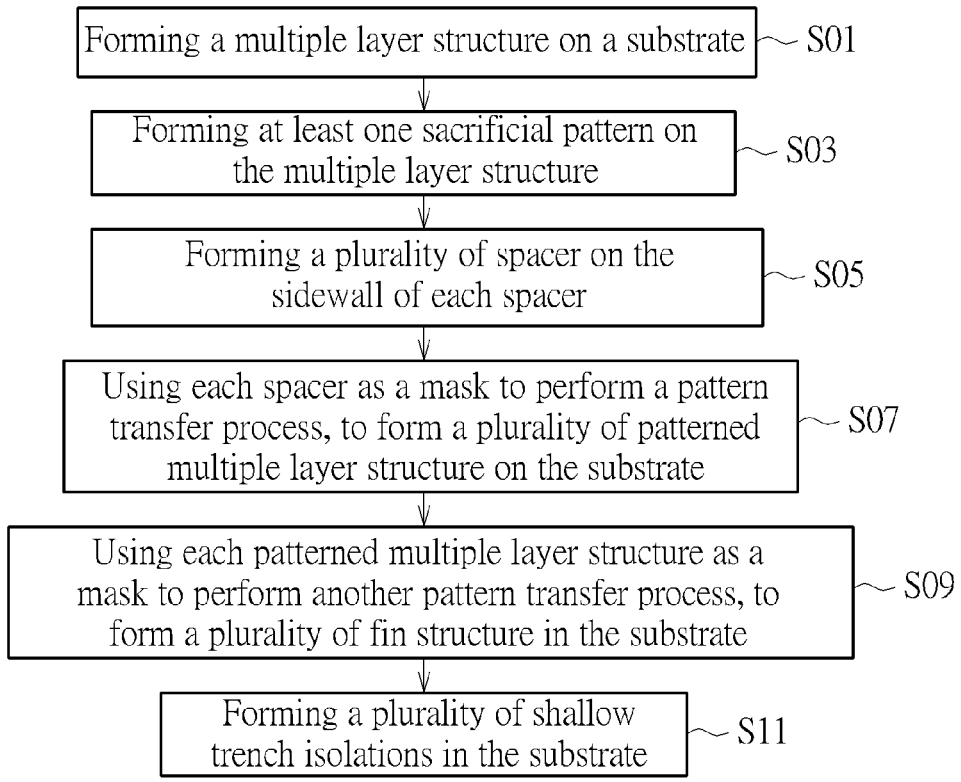
FIG. 11 is a flow chart showing a method for fabricating a fin structure according to the first preferred embodiment of the present invention.

Please refer to FIGS. 1~9 accompanied with FIG. 11. FIGS. 1-9 are schematic, cross-sectional diagrams showing a method for forming a fin structure according to the first preferred embodiment of the present invention, and FIG. 11 is a corresponding flow chart. As shown in FIGS. 1 and 11, first, a step S01 is performed, a substrate 10 is provided, such as a bulk silicon substrate or a silicon-on-insulator (SOI) substrate; then, a multiple layer structure 11 is formed on the substrate 10 as a mask, wherein the multiple layer structure 11 includes at least two materials. In this embodiment, the multiple layer structure 11 includes a top layer 12 and a bottom layer 13, which are made through a regular deposition process. Besides, a buffer layer 14 may be selectively formed between the multiple layer structure 11 and the substrate 10, wherein the buffer layer 14 not only serves as a mask in the following pattern transfer process but is also used as a protective layer to protect the substrate 10 from unwanted damages. It is worth noting that each material comprised in the multiple layer structure 11 has different etching selectivity to each other. For example, in this embodiment, the top layer 12 is silicon oxide, and the bottom layer 13 is silicon nitride; the etching rates of those two materials are different during etching processes. Besides, a buffer layer 14 is selectively formed and disposed between the multiple layer structure 11 and the substrate 10, which has different etching selectivity from the adjacent bottom layer 13. Afterwards, at least one sacrificial material layer 16 is formed on the multiple layer structure 11, which comprises a material having a different etching selectivity from the multiple layer structure 11. In this embodiment, the material of the sacrificial material layer 16 is preferably chosen to be amorphous silicon or poly silicon, which are easier to be removed during following etching processes, but not limited thereto; other suitable materials can also be selected as the material of the sacrificial material layer 16. In this embodiment, the thickness of the buffer layer 14 is about 40~80 angstroms, the thickness of the bottom layer 13 is about 300~500 angstroms, the thickness of the top layer 12 is about 200~400 angstroms, and the thickness of the sacrificial material layer 16 is about 800~1200 angstroms.

Figure 2:
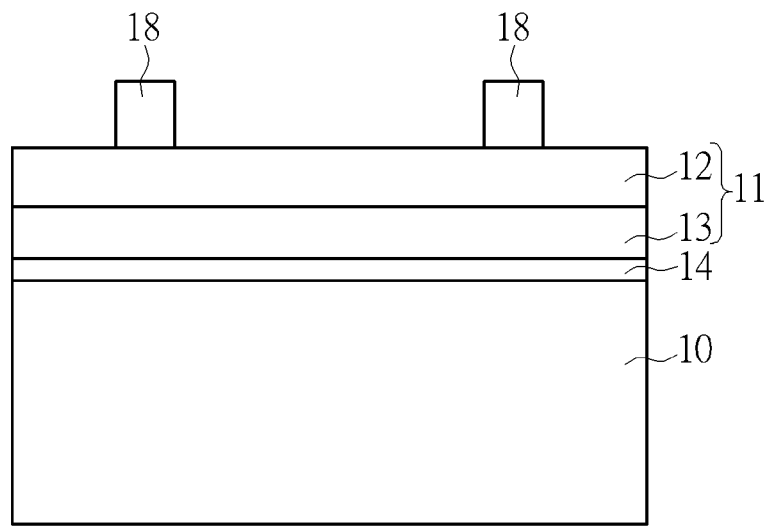
Figure 3:
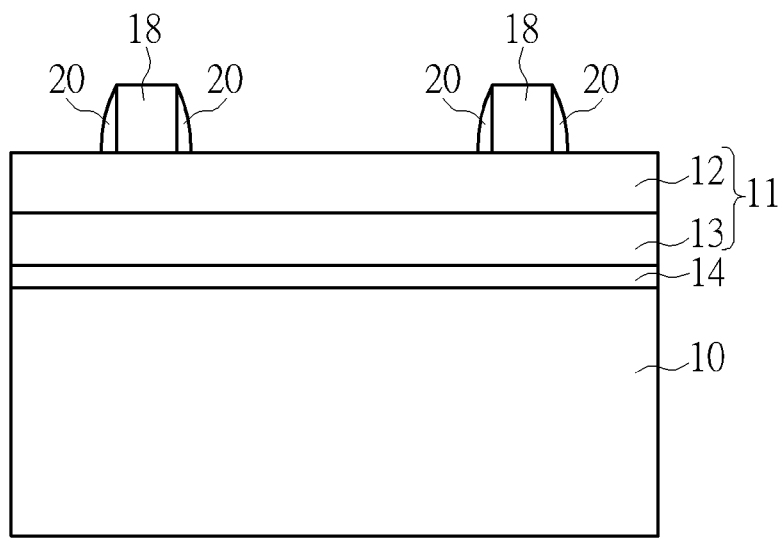

The step S03 is then performed, as shown in FIG. 2, using a photo-etching process; at least an exposure, a development and an etching process are sequentially performed to the sacrificial material layer 16. Parts of the sacrificial material layer 16 are removed and then at least one sacrificial pattern 18 is formed on the multiple layer structure 11, wherein the size of each sacrificial pattern 18 is larger than the critical dimension of the photo-lithography process. The step S05 is then performed, as shown in FIG. 3, wherein at least a material layer (not shown) is formed to cover each of the sacrificial patterns 18. The material layer may be selected to be a material having a different etching rate from that of the sacrificial patterns 18, such as silicon nitride, silicon oxide, silicon oxynitride, silicon carbide or the likes. In the present embodiment silicon nitride is selected as the material, but it is not limited thereto. Afterwards, an etching process is performed to the material layer, such as a plasma process, to form a plurality of "sail-shaped" spacers 20 on the sidewall of each sacrificial pattern 18; the size of each spacer is therefore smaller than the critical dimension. The critical dimension mentioned above generally is the minimum distance between two patterns that makes these two patterns still distinguishable in manufacturing processes after the exposure process is performed. For example, if the critical dimension is about 118 nm, when the distance between two patterns is smaller than 118 nm after the exposure process is performed in a photolithography manufacturing process, these two patterns may be connected together. In the present embodiment, the material of the spacer 20 is silicon nitride, same as the material of the bottom layer 13, but not limited thereto. In addition, the thickness of the sacrificial pattern 18 is substantially the same as the thickness of the sacrificial material layer 16, which is about 800~1200 angstroms; the thickness of the spacer 20 is about 800~1200 angstroms, the width of the spacer 20 is about 100~150 angstroms, but not limited thereto and the size could be adjusted according to the requirements.

Figure 4:
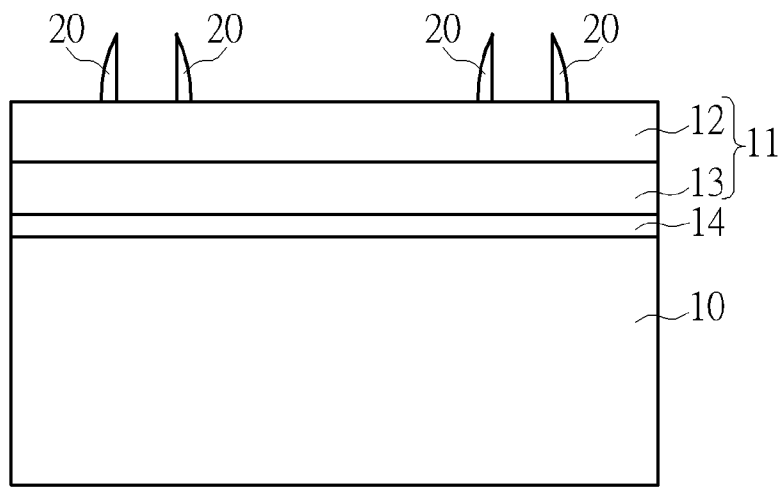
Figure 5:
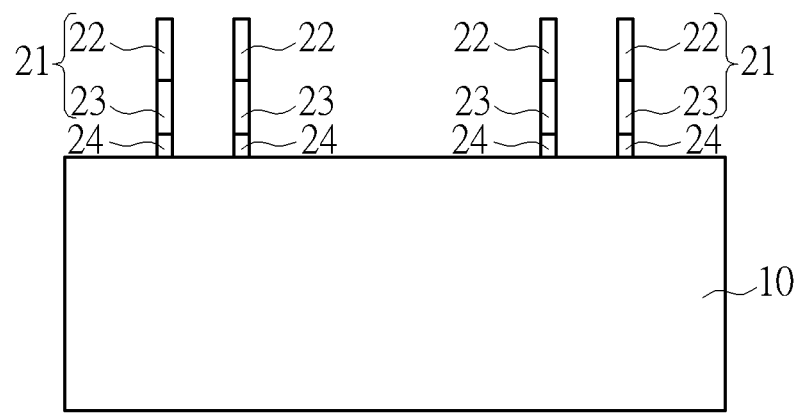

The step S07 is then performed, as shown in FIGS. 4~5. The sacrificial pattern 18 is entirely removed, the rest of the spacer 20 is used as a mask, and a pattern transfer process is performed on the multiple layer structure 11 to transfer the pattern of the spacer 20 to the multiple layer structure 11, and to form a plurality of corresponding patterned multiple layer structures 21, wherein each patterned multiple layer structure 21 includes a patterned top layer 22 and a patterned bottom layer 23 respectively. Besides, the buffer layer 14 is formed and disposed between the multiple layer structure 11 and the substrate 10, so that the pattern of the spacer 20 is transferred to the buffer layer 14 too, thereby forming a plurality of patterned buffer layers 24. It should be noted that the pattern transfer process may include a plurality of etching processes and a corresponding preferred embodiment is described as follows. First, the sacrificial patterns 18 are completely removed through a regular etching process, such as dry etching or wet etching, so that only the spacers 20 remain on the multiple layer structure 11. In this etching process, since the etching rate of the sacrificial layer 18 is higher than that of the spacer 20, only parts or even no spacers 20 are etched away. Then, by using the spacer 20 as a mask, one or more than one anisotropic etching processes are carried out to sequentially etch down the multiple layer structure 11 and the buffer layer 14. At this time, the patterns defined by the spacer 20 can be transferred to the multiple layer structure 11 and the buffer layer 14. Besides, since many etching processes are performed, at the time to etch the bottom layer 13 or the buffer layer 14, the sail-shape spacer 20 may be etched away or completely removed. Therefore, in one preferred embodiment of the present invention, since the thickness of the top layer 12 is larger than the thickness of the buffer layer 14 (the thickness of the top layer 12 is about 300 angstroms, and the thickness of the buffer layer 14 is about 40~80 angstroms), even though parts of the spacer 20 are etched and removed during the etching process for etching the buffer layer 14, parts of the patterned top layer 22 still remain, and the rest of the patterned top layer 22 can be used as a mask to protect the patterned bottom layer 23 and the patterned buffer layer 24 disposed below. It is worth noting that, the "the pattern transfer process" also includes the concepts of the "sidewall image transfer (SIT) process"; in other words, the "pattern transfer process" can be deemed as a superordinate concept of the "sidewall image transfer process". In addition, since the buffer layer 14 is selectively formed in the present invention, the patterned buffer layer 24 may or may not exist between the substrate 10 and the patterned multiple layer structure 21.

Figure 6:
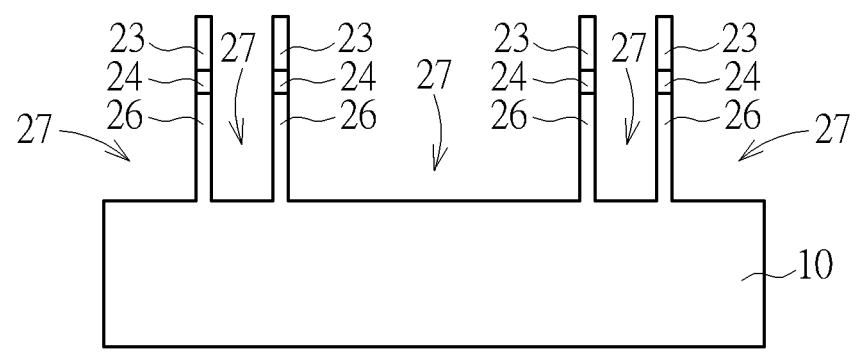

The step S09 is then performed, as shown in FIG. 6; the patterned multiple layer structure 21 is used as a mask to perform another pattern transfer process that transfers the pattern of the patterned multiple layer structure 21 to the substrate 10, so as to form a plurality of first shallow trenches 27 by removing parts of the substrate 10, and to form at least one fin structure 26 in the substrate 10 between the first shallow trenches 27. It is worth noting that the patterned top layer 22 shown in FIG. 4 has been entirely removed by the etching process in this step, hence it is not shown in FIG. 6, but the present invention is not limited thereto; the patterned top layer 22 may partially remain according to the actual manufacturing processes, which should be comprised in the scope of the present invention. In addition, the pattern transfer process in this step is similar to the pattern transfer process mentioned above (especially, in step S07), it may therefore include one or more etching processes, and will not be redundantly described.

Figure 7:
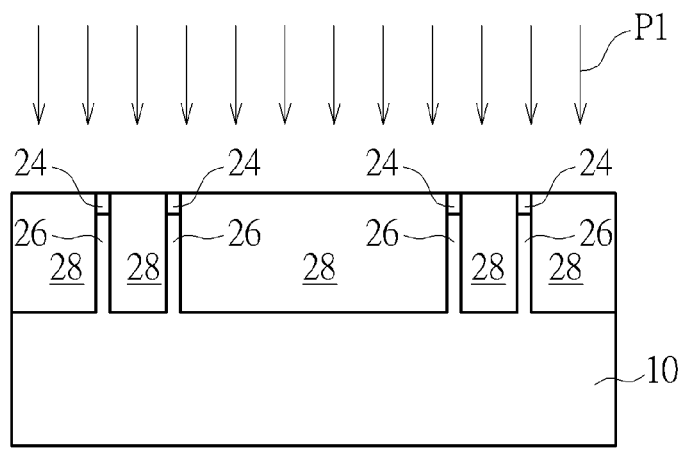

The step S11 is then performed. Please refer now to FIGS. 7~9. A plurality of shallow trench isolations (STI) is formed in the substrate 10. The detailed steps are described below: as shown in FIG. 7, a plurality of first shallow trenches 27 is disposed in the substrate 10 and besides the fin structures 26; an insulation layer is then filled in each first shallow trench 27, which may partially cover the top surface of the fin structure 26. The material of the insulation layer 28 may comprise silicon oxide or silicon nitride, so as to prevent electrical interferences between each component. Then a planarization process P1 is performed, such as a chemical-mechanical polishing (CMP), to planarize the insulation layer 28. It is worth noting that the planarization process P1 may be stopped on the surface of the patterned bottom layer 23, the surface of the patterned buffer layer 24, or on the top surface of the fin structure 26; in other words, when the planarization process P1 is performed, the polishing depth can be selected in order to polish until the patterned bottom layer 23, the patterned buffer layer 24 or the fin structure 26 is exposed. Since the sail-shaped spacers 20 have been entirely removed during the etching process mentioned above, and since the patterned top layer 22 can be used as a mask to protect the patterned bottom layer 23 and the patterned buffer layer 24 disposed below, the patterned bottom layer 23, the patterned buffer layer 24 and the fin structure 26 will have a flat top surface when the planarization process P1 is performed. The polishing is easier to stop on the top surface of these components, and no particles will be formed by the remaining spacers 20, that would provoke scratching of the components. In this embodiment, the planarization process P1 is preferably stopped on the top surface of the patterned buffer layer 24, in order to protect the fin structure 26.

Figure 8:
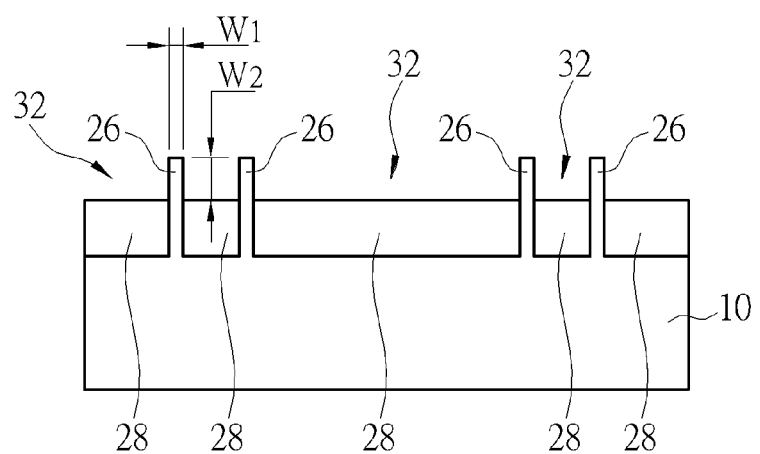

As shown in FIG. 8, the patterned buffer layer 24 disposed on the fin structure 26 is removed through an etching process, such as a SiCoNi process, which is a nitrogen trifluoride and ammonia containing cleaning process, or a wet etching process, like dilute hydrofluoric acid (DHF), to expose the top surface of the fin structure 26. Besides, another etching back process is then performed to further remove parts of the insulation layer 28, and partially expose the sidewall of each fin structure 26, thereby forming a plurality of first shallow trench isolations 32 to isolate each fin structure 26. In this embodiment, the depth of the first shallow trench isolations 32 is about 1000 angstroms, and the width of the fin structures 26 is labeled as W1, which is about 100 angstroms in this embodiment. The height of the exposed sidewall is labeled as W2, about 300 angstroms in the embodiment. Of course, the present invention is not limited thereto, the height of the first shallow trench isolation 32, the width and the height of the fin structure 26 can be adjusted according to the actual requirements. The channel width of the fin-FET which may be formed in the following steps depends on the exposed width and exposed height of the fin structure 26; for example, if the fin structure forms a tri-gate fin-FET in the following steps, the channel width of the tri-gate fin-FET is W1+W2+W2. Besides, a cap layer may be further formed or the remaining patterned buffer layer 24 may be kept on the top surface of the fin structure 26 in following steps, thereby forming a double-gate fin-FET fin structure 26 that should be comprised in the scope of the present invention.

Figure 9:
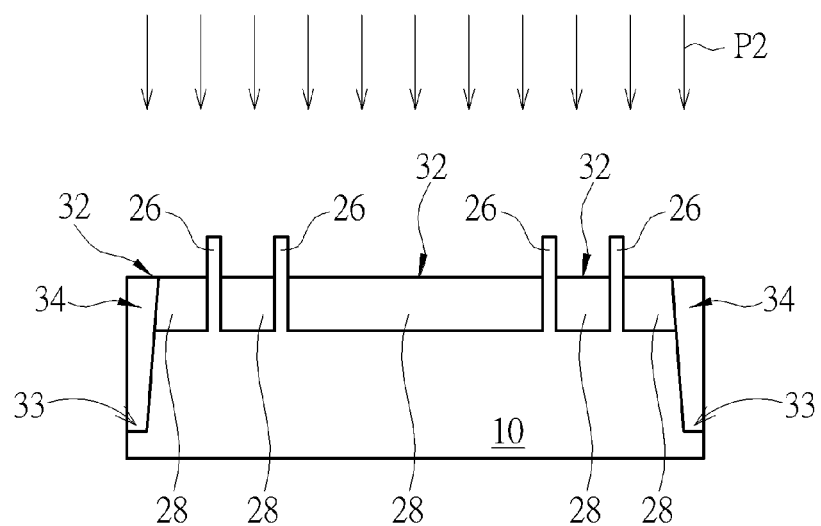

In a preferred embodiment of the present invention, as shown in FIG. 9, another etching process is performed; at least one second shallow trench 33 is formed in the substrate 10 and in the insulation layer 28, and another insulation layer (not shown) is then filled in each second shallow trench 33, also covering each fin structure 26. A second planarization process P2 is then performed, such as a CMP similar to the first planarization process P1, to remove parts of the insulation layer, and at least one second shallow trench isolation 34 is formed, wherein the second shallow trench isolation 34 preferably surrounds the fin structure 26 and the first shallow trench isolation 32, but not limited thereto. It is worth noting that the second shallow trench isolation 34 is preferably deeper than the first shallow trench isolation 32 in this embodiment (for example, the depth of the second shallow trench isolation 34 is about 2000~2500 angstroms), in order to isolate each components more effectively, but not limited thereto; the depth of the second shallow trench isolation 34 may be equal to or smaller than the depth of the first shallow trench isolation 32, which also could be comprised in the scope of the present invention. Finally, another etching back process may be performed to partially expose each fin structure 26 to achieve the method for forming a fin structure of the present invention. The fin structure of the present invention can be accompanied with others related semiconductor processes, such as fin-FET processes. For simplifying the description the fin-FET technology will not be described here, since it is not the main technology feature of the present invention.

Figure 10:
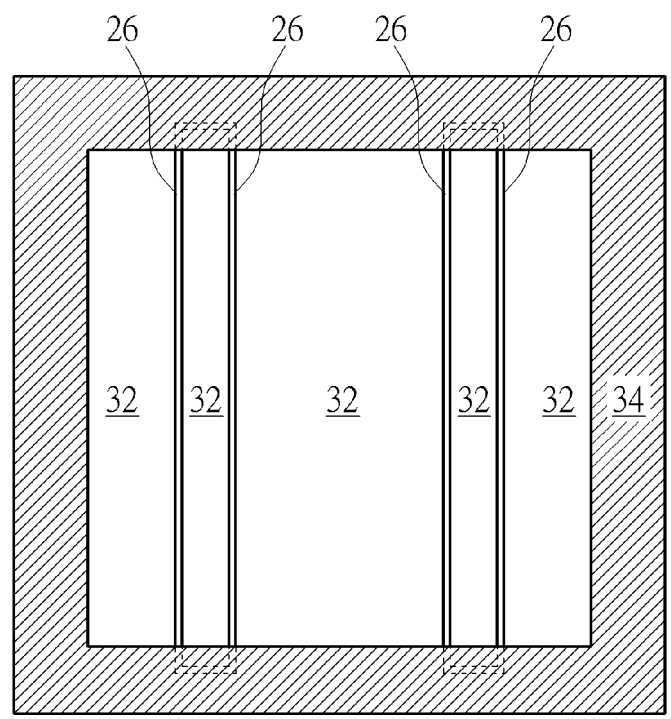
FIG. 10 is a top view diagram of the structure of FIG. 9.

It is worth noting that, the second shallow trench isolation 34 of the present invention may also achieve slot-cut functions. Please refer to FIGS. 3~10, wherein FIG. 10 is the top view diagram of the structure of FIG. 9. Since the spacers 20 are used as a mask during the pattern transfer process, the spacers 20 may surround the sacrificial pattern 18 when observing from a top view, so the fin structure 26 appears as a rectangular ring shape when observing from a top view. In order to use the fin structure to form a fin FET in the following steps, the rectangular ring shaped fin structure 26 is preferably divided into two strip shape fin structures 26. In order to reach the goal described above, parts of the fin structure 26 can be removed when the second shallow trench 33 is formed, especially the two ends portions (shown as dotted lines in FIG. 10); the two ends of the fin structure 26 are cut and removed, and each rectangular ring shaped fin structure 26 becomes a two strip shaped fin structure 26, and they are not connected to each other anymore, as shown in FIG. 10. The second shallow trench isolation 34 surrounds the fin structures 26 and the first shallow trench isolation 32 to electrically isolate the fin structures 26 from others components and slot-cut the fin structure 26 to become the desired pattern.

Figure 12:
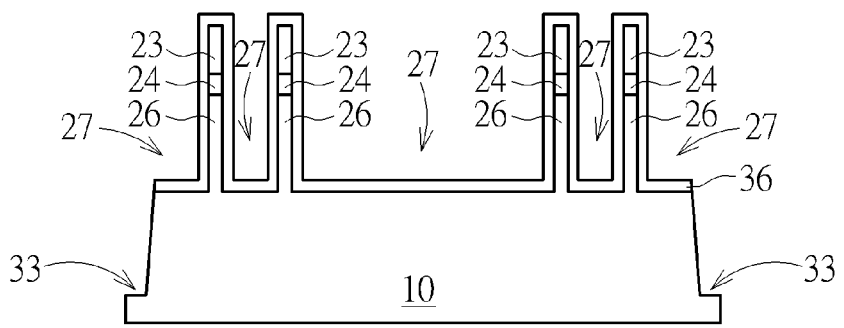
FIG. 12 is schematic, cross-sectional diagram showing a method for forming a fin structure according to the second preferred embodiment of the present invention.

In the first preferred embodiment of the present invention, please refer to FIG. 7~9, the first shallow trench 27 is first formed and filled by the insulation layer 28, the first planarization process P1 is then performed to complete a plurality of first shallow trench isolations 32; the second shallow trench 33 is then formed, and the insulation layer is filled, and the second planarization process P2 is performed to complete at least one second shallow trench isolation 34. But the present invention is not limited thereto; in the second preferred embodiment of the present invention, the steps for forming the fin structure 26 are similar to the steps of the first preferred embodiment described above (please refer to FIGS. 1~6). Please refer to FIG. 12; the present invention may also comprise forming the first shallow trench 27 and the second shallow trench 33 (wherein the sequence of the formation of the first shallow trench 27 and the second shallow trench 33 can be exchanged), then a insulation layer is filled in the first shallow trench 27 and the second shallow trench 33 simultaneously, and a planarization process is performed only once to remove parts of the insulation layer so as to complete the first shallow trench isolation 32 and the second shallow trench isolation 34 simultaneously. Finally, an etching back process is performed to partially expose each fin structure, wherein the final structure is similar to that of FIG. 9. The manufacturing process should be comprised in the scope of the present invention, and the other material properties and manufacturing methods are similar to those of the first preferred embodiment detailed above and will not be redundantly described. Besides, it is worth noting that if the first shallow trench 27 is formed before the second shallow trench 33, a sacrificial material layer 36 may be selectively formed in the first shallow trench 27 after the first shallow trench 27 but before the second shallow trench 33 is formed so as to protect the destruction of the first shallow trench 27 from the following etching processes. The sacrificial material layer 36 can be an insulation layer such as a silicon nitride or a silicon oxide, or an adhesion layer to improve the adhesivity between the substrate 10 and the insulation layer 28.

Figure 13:
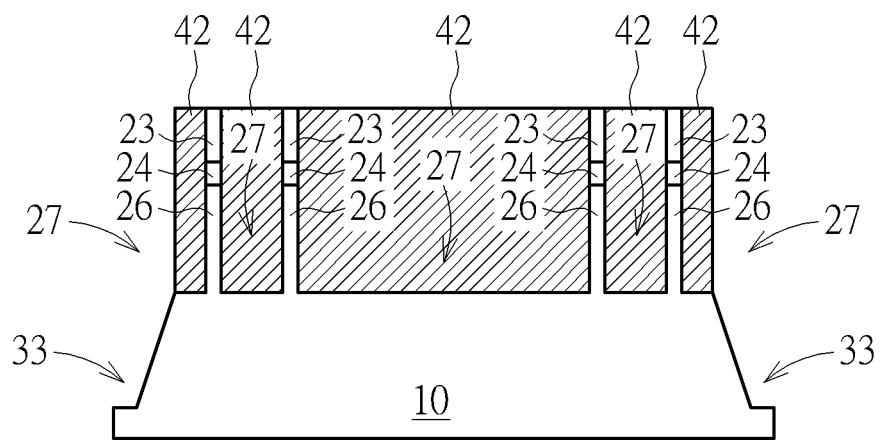
FIG. 13 is schematic, cross-sectional diagram showing a method for forming a fin structure according to the third preferred embodiment of the present invention.

In the third preferred embodiment of the present invention, the steps for forming the fin structure 26 are similar to the steps of the first preferred embodiment described above (please refer to FIGS. 1~6). Please refer to FIG. 13; a photoresist layer 42 is formed on the substrate 10, wherein the photoresist layer 42 fills each first shallow trench 27. A photolithography and an etching process are then performed to remove parts of the photoresist layer 42 and to form at least one second shallow trench 33 in the substrate which is not covered by the rest of the photoresist layer 42. Afterwards, the rest of the photoresist layer 42 is removed, then, an insulation layer is filled in the first shallow trenches 27 and the second shallow trenches 33 simultaneously, and a planarization process is performed only once to remove parts of the insulation layer so as to complete the first shallow trench isolation 32 and the second shallow trench isolation 34 simultaneously. Finally, an etching back process is performed to partially expose each fin structure, wherein the final structure is similar to that of FIG. 9. The manufacturing process should be comprised in the scope of the present invention, and the other material properties and manufacturing methods are similar to those of the first preferred embodiment detailed above and will not be redundantly described.

Figure 14:
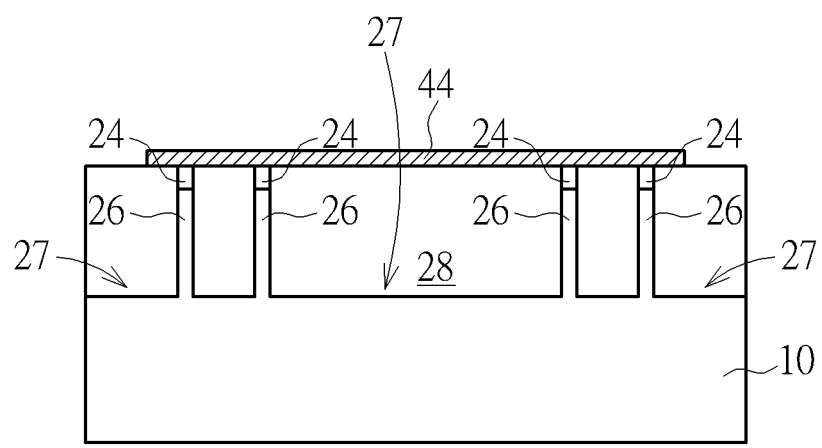
FIG. 14 is schematic, cross-sectional diagram showing a method for forming a fin structure according to the fourth preferred embodiment of the present invention.

In the fourth preferred embodiment of the present invention, the steps for forming the fin structure 26 are similar to the steps of the first preferred embodiment described above (please refer to FIGS. 1~6). An insulation layer 28 is filled in each first shallow trench 27, and a first planarization process P1 is then performed (please refer to FIG. 7). Afterwards, as shown in FIG. 14, a patterned photoresist layer 44 is formed on the top of the insulation layer 28. The patterned photoresist layer 44 is used as a hard mask to perform an etching process, removing parts of the insulation layer 28 and parts of the substrate 10, so as to form at least one second shallow trench 33 in the substrate 10. After the patterned photoresist layer is removed, another insulation layer (not shown) is filled in each second shallow trench 33. Another planarization process (not shown) is then performed, such as a CMP similar to the first planarization process P1, to remove parts of the insulation layer, so as to complete at least one second shallow trench isolation 34. Finally, an etching back process is performed to partially expose each fin structure, wherein the final structure is similar to that of FIG. 9. The manufacturing process should be comprised in the scope of the present invention, and the other material properties and manufacturing methods are similar to those of the first preferred embodiment detailed above and will not be redundantly described.

To summarize the mentioned description above, the present invention uses a sidewall image transfer (SIT) process to transfer patterns. In general, SIT processes may include the following steps. First, a plurality of dummy patterns is formed on a substrate, wherein the dimension of the sacrificial patterns is larger than the critical dimension. Then, spacers are formed on the sidewalls of the sacrificial patterns through a deposition and an etching process. Since the dimension of the spacers may be smaller than the critical dimension, patterns of the spacers may be transferred into the substrate by using the spacers as mask to form a smaller fin structure. The feature of the present invention further comprises a multiple layer structure disposed between the substrate and the spacer, wherein the spacer is first used as a mask to transfer the pattern of the spacer to the multiple layer structure, and the patterned multiple layer structure is then used as a mask to transfer the pattern to the substrate, and to form a plurality of fin structures in the substrate. In this way, a flatter surface may be formed on the top of the multiple layer structure through at least two pattern transfer processes. Thus the mask disposed on the fin structure is not easily damaged during the pattern transfer process, and the pattern can be transferred to the fin structure completely, thereby improving the process yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a fin structure, comprising the following steps:
   forming a multiple layer structure on a substrate;
   forming a sacrificial pattern on the multiple-layer structure;
   forming a spacer on the sidewall of the sacrificial pattern that is disposed on the multiple-layer structure;
   removing the sacrificial pattern;
   using the spacer as a cap layer to etch parts of the multiple-layer structure, and then using the multiple-layer structure as a cap layer to etch the substrate to form at least one fin structure and at least one first shallow trench in the substrate;
   filling a first insulation layer in each first shallow trench;
   performing a planarization process to the first insulation layer;
   then forming at least one second shallow trench in the substrate, wherein the second shallow trench is deeper than the first shallow trench;
   filling a second insulation layer in each second shallow trench; and
   performing another planarization process to the second insulation layer.

2. The method of claim 1, wherein the multiple layer structure includes a plurality of materials, each material having a different etching selectivity from one another.

3. The method of claim 1, wherein at least one material of the multiple layer structure is the same as the material of the spacer.

4. The method of claim 1, wherein the multiple layer structure at least comprises a silicon oxide layer and a silicon nitride layer disposed on the silicon oxide layer.

5. The method of claim 1 further comprising forming a buffer layer disposed between the multiple layer structure and the substrate.

6. The method of claim 5, wherein the buffer layer comprises silicon oxide.

7. The method of claim 1, further comprising removing parts of the fin structure through the etching process when each second shallow trench is formed, wherein the removed part of the fin structure is the part overlapped with the second shallow trench.

8. The method of claim 1, wherein the planarization process is stopped at the multiple layer structure.

9. The method of claim 1, further comprising:
   forming at least one first shallow trench in the substrate;
   forming at least one second shallow trench in the substrate, wherein the second shallow trench is deeper than the first shallow trench;
   filling an insulation layer on each fin structure, in each first shallow trench and in each second shallow trench; and
   performing a planarization process to the insulation layer.

10. The method of claim 9, further comprising removing parts of the fin structure through the etching process when each second shallow trench is formed, wherein the removed part of the fin structure is the part overlapped with the second shallow trench.

11. The method of claim 9, further comprising filling a sacrificial material layer in each first shallow trench before each second shallow trench is formed.

12. The method of claim 9, further comprising performing an etching back process to remove the insulation layer disposed on each fin structure and to partially expose each fin structure.

13. The method of claim 1, wherein the sacrificial pattern can be selected from the group of amorphous silicon and poly silicon.

14. A method for forming a fin structure, comprising the following steps:
   forming a plurality of patterned multiple layer structures on a substrate, wherein each patterned multiple layer structure includes a patterned top layer and a patterned bottom layer respectively, and at least one patterned buffer layer is disposed between the substrate and each patterned multiple layer structure;
   using the multiple-layer structure as a mask to etch the substrate to form at least one fin structure and at least one first shallow trench in the substrate through an etching process, wherein the patterned top layer is entirely removed during the etching process, but parts of the patterned bottom layer and the patterned buffer layer still remains on the fin structure;
   filling a first insulation layer in each first shallow trench;
   performing a planarization process to the first insulation layer;
   then forming at least one second shallow trench in the substrate, wherein the second shallow trench is deeper than the first shallow trench;
   filling a second insulation layer in each second shallow trench; and
   performing another planarization process to the second insulation layer.

15. The method of claim 14, wherein the patterned top layer comprises silicon oxide, and the patterned bottom layer comprises silicon nitride.

16. The method of claim 14, wherein the patterned buffer layer comprises silicon oxide layer.

* * * * *